(12) United States Patent
Liu et al.

(10) Patent No.: US 11,881,633 B2
(45) Date of Patent: Jan. 23, 2024

(54) PHASE SHIFTER AND ELECTRICALLY TUNABLE ANTENNA

(71) Applicant: Huawei Technologies Co., Ltd., Shenzhen (CN)

(72) Inventors: Peng Liu, Shenzhen (CN); Xinming Liu, Xi'an (CN); Hongzhi Zhang, Dongguan (CN); Jiejun Zhou, Xi'an (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 176 days.

(21) Appl. No.: 17/406,357

(22) Filed: Aug. 19, 2021

(65) Prior Publication Data

US 2021/0384625 A1    Dec. 9, 2021

Related U.S. Application Data

(63) Continuation of application No. PCT/CN2020/076081, filed on Feb. 20, 2020.

(30) Foreign Application Priority Data

Feb. 20, 2019 (CN) .......................... 201910134990.0

(51) Int. Cl.
*H01Q 3/34* (2006.01)
*H01Q 5/335* (2015.01)
*H01Q 13/18* (2006.01)

(52) U.S. Cl.
CPC .............. *H01Q 3/34* (2013.01); *H01Q 5/335* (2015.01); *H01Q 13/18* (2013.01)

(58) Field of Classification Search
CPC .. H01P 1/18; H01P 1/184; H01P 1/182; H01P 1/047; H01P 1/064; H01P 5/04
See application file for complete search history.

(56) References Cited

U.S. PATENT DOCUMENTS

| | | | | |
|---|---|---|---|---|
| 5,115,217 | A | * 5/1992 | McGrath | H01P 5/04 333/263 |
| 5,410,283 | A | 4/1995 | Gooray et al. | |
| 5,905,462 | A | * 5/1999 | Hampel | H01Q 3/26 342/368 |
| 7,283,015 | B1 | * 10/2007 | Rockenbauch | H01P 1/184 333/33 |
| 10,910,688 | B2 | * 2/2021 | Chen | H01P 1/184 |

(Continued)

FOREIGN PATENT DOCUMENTS

| CN | 101894989 A | 11/2010 |
|---|---|---|
| CN | 104037475 A | 9/2014 |

(Continued)

*Primary Examiner* — Seokjin Kim
(74) *Attorney, Agent, or Firm* — Slater Matsil, LLP

(57) ABSTRACT

This application provides a phase shifter and an electrically tunable antenna including the phase shifter, where the phase shifter includes a tuning accessory, and the tuning accessory includes a tuning portion for tuning input impedance of the phase shifter. One additional capacitance or inductance parameter is added in the phase shifter by using the tuning portion, to affect input impedance of a port, to further affect a port standing wave, thereby tuning the port standing wave by using the tuning accessory. In addition, the tuning accessory in this application is a molded part with a fixed structure.

20 Claims, 7 Drawing Sheets

(56) References Cited

U.S. PATENT DOCUMENTS

| | | | |
|---|---|---|---|
| 2005/0253669 A1 | 11/2005 | Tillery | |
| 2017/0288306 A1* | 10/2017 | Sledkov | H01P 1/184 |
| 2018/0123240 A1* | 5/2018 | Liao | H01P 1/18 |
| 2019/0067770 A1* | 2/2019 | Kim | H01P 1/182 |
| 2019/0237836 A1* | 8/2019 | Ding | H01P 1/184 |
| 2020/0067159 A1* | 2/2020 | Chen | H01P 1/184 |
| 2021/0384627 A1* | 12/2021 | Nikolayenkov | H01P 5/04 |
| 2022/0166139 A1* | 5/2022 | Göttl | H01P 1/184 |

FOREIGN PATENT DOCUMENTS

| | | | | |
|---|---|---|---|---|
| CN | 104505560 A | 4/2015 | | |
| CN | 105161797 A | 12/2015 | | |
| CN | 106450763 A | 2/2017 | | |
| CN | 206211029 U | 5/2017 | | |
| CN | 108987928 A | 12/2018 | | |
| EP | 3879628 A1 * | 9/2021 | | H01P 1/184 |
| JP | 2018037928 A | 3/2018 | | |
| WO | 2018159972 A1 | 9/2018 | | |

\* cited by examiner

PHASE SHIFTER AND ELECTRICALLY TUNABLE ANTENNA

CROSS-REFERENCE TO RELATED APPLICATIONS

This application is a continuation of International Application No. PCT/CN2020/076081, filed on Feb. 20, 2020, which claims priority to Chinese Patent Application No. 201910134990.0, filed on Feb. 20, 2019. The disclosures of the aforementioned applications are hereby incorporated by reference in their entireties.

TECHNICAL FIELD

This application relates to the field of communications technologies, and in particular, to a phase shifter and an electrically tunable antenna.

BACKGROUND

Due to the popularity of smartphones and the deployment of 5G networks, users have an increasing demand for high-speed data services. Therefore, modern mobile communications are developing in a multi-band multi-mode direction. It is increasingly difficult to obtain available site resources and a site has an increasing requirement for integration into the surrounding environment. Therefore, multi-band antennas and network convergence antennas with higher integration become future development directions of base station antennas.

A phase shifter is an important component in a multi-band antenna, and the multi-band antenna transmits signals of a plurality of bands through tuning of the phase shifter. However, currently, in most cases, a port standing wave of a phase shifter is unqualified, and the port standing wave of the phase shifter needs to be tuned. In the related art, when a port standing wave of a phase shifter is being tuned, a magnitude of the standing wave is generally tuned by manually increasing or decreasing a solder amount at each port of the phase shifter, and after the tuning, passive inter modulation (PIM) is tested. If the PIM is faulty, the PIM is retested after maintenance. As a result, a standing wave tuning time increases geometrically.

SUMMARY

This application provides a phase shifter and an electrically tunable antenna, to provide a simple and convenient solution in which PIM of an array does not need to be retested, thereby reducing a standing wave tuning time.

According to a first aspect, this application provides a phase shifter, where the phase shifter includes a cavity, a metal strip line, and a tuning accessory. The metal strip line is located in the cavity, the tuning accessory includes a fixing portion and a tuning portion connected to the fixing portion, and the fixing portion is fastened to the cavity; the tuning portion is located in the cavity, the tuning portion is partially or completely opposite to the metal strip line, and an orthographic projection of a part that is of the tuning portion and that is opposite to the metal strip line is located on the metal strip line; and the tuning portion is used to tune input impedance of the phase shifter.

In this application, one tuning accessory is added to the phase shifter, and the tuning accessory includes a tuning portion that can affect input impedance of a port. Specifically, one additional capacitance or inductance can be added to the phase shifter by using the tuning portion, and the input impedance of the port is affected by using the additional parameter, thereby tuning a port standing wave by using the tuning accessory. Further, because the tuning accessory has a specific fixed structure and is a molded part, compared with a manner of manually increasing or decreasing a solder amount in the related art, the tuning accessory has higher surface precision and fewer surface defects, and therefore PIM is not affected, so that after the tuning of the port standing wave is completed, the PIM does not need to be retested, thereby reducing a standing wave tuning time.

In this application, the fixing portion is fastened to the cavity, and the tuning portion is movable relative to the metal strip line to tune the input impedance of the phase shifter.

In this application, before the fixing portion is fastened to the cavity, the tuning portion moves relative to the metal strip line, to change a relative position or a relative area between the tuning portion and the metal strip line, a distance between the metal strip line and the tuning portion, or the like. Therefore, an amplitude of the additional capacitance added to the phase shifter by the tuning portion is changed, and a standing wave of each port of the phase shifter is changed. Therefore, by moving the tuning accessory along the metal strip line before the tuning accessory is fastened to the cavity, and monitoring the port standing wave of the phase shifter at the same time, when the tuning portion moves to a position at which the port standing wave of the phase shifter reaches an optimal state, the fixing portion of the tuning accessory is fastened to the cavity, so that the tuning portion is fastened at the position at which the port standing wave of the phase shifter is in an optimal state. In addition, for different phase shifters, different positions of the tuning portion in the phase shifter can be adjusted, to tune a standing wave of each port of the phase shifter to an optimal state.

In some embodiments of this application, the tuning portion is a metal sheet, and the metal sheet is spaced from the metal strip line; or the tuning portion is a dielectric slab, and the dielectric slab at least partially covers the metal strip line or is spaced from the metal strip line. The dielectric slab is formed of a dielectric material having a dielectric constant different from that of air.

When the tuning portion is a metal sheet, and there is a gap between the metal sheet and the metal strip line, the metal sheet, the metal strip line, and a dielectric located between the metal sheet and the metal strip line form an additional capacitance, and input impedance of a port of the phase shifter is affected. When the tuning portion is a dielectric slab, a dielectric constant of a dielectric in the cavity can be changed by the dielectric slab, to change a capacitance at a position corresponding to the dielectric slab in the cavity. In other words, it is equivalent to adding the additional capacitance at the position corresponding to the dielectric slab in the cavity.

In some embodiments, a side wall of the cavity is provided with a tuning hole, a first end of the fixing portion is connected to the tuning portion, and a second end opposite to the first end is located in the tuning hole. Before the fixing portion is fastened to the cavity, the second end of the fixing portion is adjusted to move in a length direction of the tuning hole, to drive the tuning portion to move relative to the metal strip line. Amplitudes of additional capacitances generated by the tuning portion at different positions of the metal strip line change, and the tuning portion is driven to move relative to the metal strip line, so that the port standing wave of the phase shifter can be adjusted. When the tuning portion moves to a position at which the port standing wave of the phase shifter is in an optimal state, the fixing portion of the tuning accessory is fastened to the cavity, so that a position of the tuning portion relative to the metal strip line is fixed, to adjust the port standing wave of the phase shifter to an optimal state.

Further, the tuning hole has a specific width, and a width direction of the tuning hole is perpendicular to an extension direction of the tuning hole, so that the fixing portion may also move in the width direction of the tuning hole before being fastened to the cavity. Therefore, the fixing portion can drive the tuning portion to move relative to the metal strip line and in an extension direction of the metal strip line, move in a direction perpendicular to the extension direction of the metal strip line, or move in a direction close to or away from the metal strip line.

In an embodiment, an extension direction of the tuning hole is the same as an extension direction of the metal strip line, and the second end of the fixing portion moves in the extension direction of the tuning hole, to drive the tuning portion to move in the extension direction of the metal strip line, so that the tuning portion corresponds to different positions in the extension direction of the metal strip line. Because of periodicity of a radio frequency signal transmitted on the metal strip line, when the tuning portion corresponds to different positions in the extension direction of the metal strip line, an amplitude of an additional parameter formed by the tuning portion in the cavity changes periodically. Therefore, the position of the tuning portion corresponding to the extension direction of the metal strip line is moved, to tune the input impedance of the phase shifter, thereby tuning the port standing wave of the phase shifter. The tuning portion may be a metal sheet or a dielectric slab.

In another embodiment, a plane on which the side wall provided with the tuning hole is located is parallel to a plane on which the metal strip line is located, the length direction of the tuning hole is perpendicular to an extension direction of the metal strip line, and the second end of the fixing portion moves in an extension direction of the tuning hole, to drive the tuning portion to move in a direction perpendicular to the extension direction of the metal strip line. In this embodiment, the fixing portion drives the tuning portion to move in a direction perpendicular to the extension direction of the metal strip line, to adjust a relative area between the tuning portion and the metal strip line, thereby adjusting the change of the amplitude of the additional capacitance brought by the tuning portion, to tune the input impedance of the phase shifter, thereby tuning the port standing wave of the phase shifter. The tuning portion may be a metal sheet or a dielectric slab.

The tuning hole is used to fit the tuning portion into the cavity, and the second end of the fixing portion extends out of the cavity through the tuning hole. A size of the tuning hole is greater than a size of the tuning portion, and the tuning portion may penetrate into the cavity through the tuning hole. When the port standing wave of the phase shifter is qualified, it is obtained that the phase shifter may not have the tuning accessory; and when it is detected that the port standing wave of the phase shifter is unqualified, the tuning portion can penetrate into the cavity through the tuning hole, to tune the port standing wave of the phase shifter. One end that is of the fixing portion and that is away from the tuning portion extends out of the cavity through the tuning hole, so that the fixing portion can be controlled to move along the tuning hole.

In some other embodiments of this application, the fixing portion includes a rotating shaft, an axis of the rotating shaft is perpendicular to a plane on which the metal strip line is located, and before the fixing portion is fastened to the cavity, the rotating shaft rotates to drive the tuning portion to rotate relative to the metal strip line. The rotating shaft rotates to drive the tuning portion to rotate relative to the metal strip line, so that the tuning portion is relatively located at different positions on the metal strip line, thereby changing the amplitude of the additional capacitance brought by the tuning portion, to tune the input impedance of the phase shifter, thereby tuning the port standing wave of the phase shifter.

In an embodiment of this application, a distance between the rotating shaft and one end that is of the tuning portion and that is away from the rotating shaft is greater than a width of the metal strip line. Because the distance between the rotating shaft and one end that is of the tuning portion and that is away from the rotating shaft is greater than the width of the metal strip line, when the tuning portion is rotated to a position intersecting the metal strip line, a relative area between the tuning portion and the metal strip line changes continuously. Therefore, when the relative position between the tuning portion and the metal strip line changes, the relative area also changes, and the value of the additional parameter can be changed more easily.

In some other embodiments of this application, the tuning portion is a metal dome, and the metal dome is spaced from the metal strip line. The metal dome includes a fixed region and an active region connected to the fixed region, and before the fixing portion is relatively fastened to the cavity, a distance between the active region and the metal strip line is adjustable. The distance between the active region of the metal dome and the metal strip line can be changed to adjust the amplitude of the additional capacitance brought by the tuning portion. In this application, before the fixing portion is fastened to the cavity, the tuning accessory first moves along the tuning hole, so that the tuning portion is located at a proper position relative to the metal strip line and there is a proper relative area between the tuning portion and the metal strip line. Then, the distance between the active region and the metal strip line is adjusted, to further fine-tune the amplitude of the additional capacitance. After the port standing wave of the phase shifter is in a better state, the fixing portion is fastened to the cavity.

Further, in this embodiment, one screw is connected on the cavity, one end of the screw passes through a cavity wall of the cavity and abuts against the active region of the metal dome, and a depth at which the screw is screwed into the cavity wall of the cavity is adjusted, to adjust a distance between the free end and the metal strip line. When the distance between the free end and the metal strip line is adjusted to a required position, the screw can be directly fastened to the cavity wall, so that the active region of the metal dome is fastened to the position of the metal strip line.

In some other embodiments of this application, a cavity wall of the cavity is provided with a plurality of openings spaced apart, and the tuning accessory is disposed in one or more of the plurality of openings. The tuning accessory is a dielectric block, and a dielectric constant of the dielectric block is greater than that of air.

A quantity of tuning accessories disposed in the plurality of openings is adjusted based on an actual requirement. Because the tuning accessory is a dielectric block having a dielectric constant greater than that of air, when different quantities of tuning accessories extend into the cavity, changes of the dielectric constant brought by the tuning accessories are different, so that amplitudes of additional capacitances brought by the tuning accessories are also different. In other words, the quantity of tuning accessories extending into a port in the cavity is changed, to change the amplitudes of the additional capacitances brought by the tuning accessories, until the port standing wave of the phase shifter is in an optimal state.

In an embodiment, a part of the tuning accessory extends into the cavity through the opening, and the part of the tuning accessory that extends into the cavity is the tuning portion. A volume of the tuning portion disposed in the cavity is adjusted by adjusting the quantity of the tuning accessories inserted into the plurality of openings, thereby changing the amplitude of the additional capacitance brought by the tuning portion, to tune the port standing wave of the phase shifter.

In an embodiment, the metal strip line further includes a signal input terminal and a signal output terminal, the signal input terminal and the signal output terminal each correspond to one opening, an axial projection of the opening corresponding to the signal input terminal is located on the signal input terminal, and an axial projection of the opening corresponding to the signal output terminal is located on the signal output terminal. Because the openings are provided at positions of the phase shifter in the related art corresponding to the signal input terminal and the signal output terminal, the tuning accessory is disposed in the openings corresponding to the signal input terminal and the signal output terminal, so that the port standing wave of the phase shifter can be tuned, and there is no need to additionally provide an opening on the cavity wall of the cavity of the phase shifter, to reduce the manufacturing process.

In some other embodiments of this application, an open-circuit line extends on the metal strip line, one end that is of the open-circuit line and that is away from the metal strip line is a free end, the tuning portion is formed of a dielectric material, the tuning portion is sleeved on the open-circuit line from the free end, and a length of the open-circuit line is less than or equal to a length of the tuning portion. A cavity wall of the cavity is provided with a tuning hole, the fixing portion is connected to the tuning portion, and the fixing portion moves in an extension direction of the tuning hole before being fastened to the cavity, and drives the tuning portion to move relative to the open-circuit line. The tuning portion can be driven to move relative to the open-circuit line to change a relative area between the open-circuit line and the tuning portion, thereby changing the additional capacitance. When the additional capacitance is changed so that the port standing wave of the phase shifter is in a better state, the fixing portion of the tuning accessory is fastened to the cavity, namely, the tuning portion is fastened to the position of the open-circuit line, so that the port standing wave of the phase shifter remains in the better state.

According to a second aspect, this application further provides an electrically tunable antenna, where the electrically tunable antenna includes a radiating element and the phase shifter, the radiating element is connected to the phase shifter, and an electromagnetic wave signal transmitted by the phase shifter is radiated by the radiating element.

BRIEF DESCRIPTION OF THE DRAWINGS

To describe the structural features and functions of this application more clearly, the following describes this application in detail with reference to the accompanying drawings and specific embodiments.

DETAILED DESCRIPTION OF ILLUSTRATIVE EMBODIMENTS

The following describes the technical solutions in the embodiments of this application with reference to the accompanying drawings in the embodiments of this application.

Figure 1:
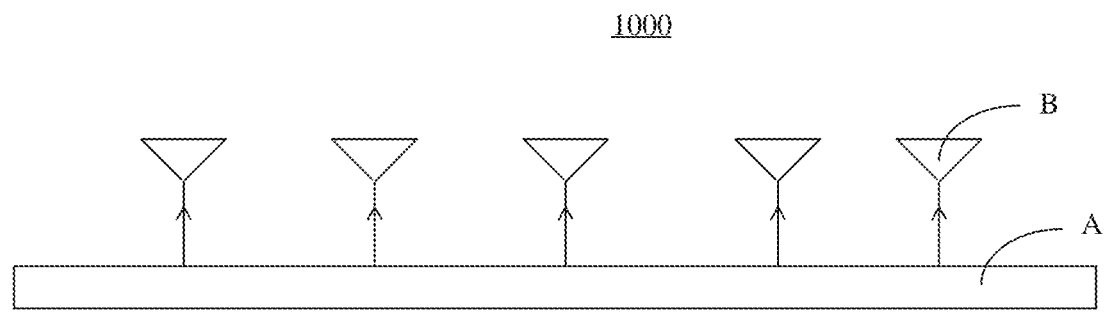
FIG. 1 is a schematic structural view of an electrically tunable antenna according to this application.

Referring to FIG. 1, this application provides an electrically tunable antenna 1000. The electrically tunable antenna 1000 includes a phase shifter A and a radiating element B in a radio frequency connection to the phase shifter A. A signal that needs to be radiated by the radiating element B is changed to a required phase by the phase shifter A, and then radiated by the radiating element B. The radio frequency connection includes an electrical connection, a coupling connection, or the like. There may be one or more radiating elements B, and each radiating element B is in a radio frequency connection to one signal output port of the phase shifter A. In some embodiments of this application, the phase shifter A is in a strip shape. There are five radiating elements B, and the five radiating elements B are spaced apart in a length direction of the phase shifter A. In this embodiment, the radiating element B is a radiating antenna. Further, the electrically tunable antenna 1000 may include one or more independent phase shifters A, to meet an actual use requirement.

Figure 2:
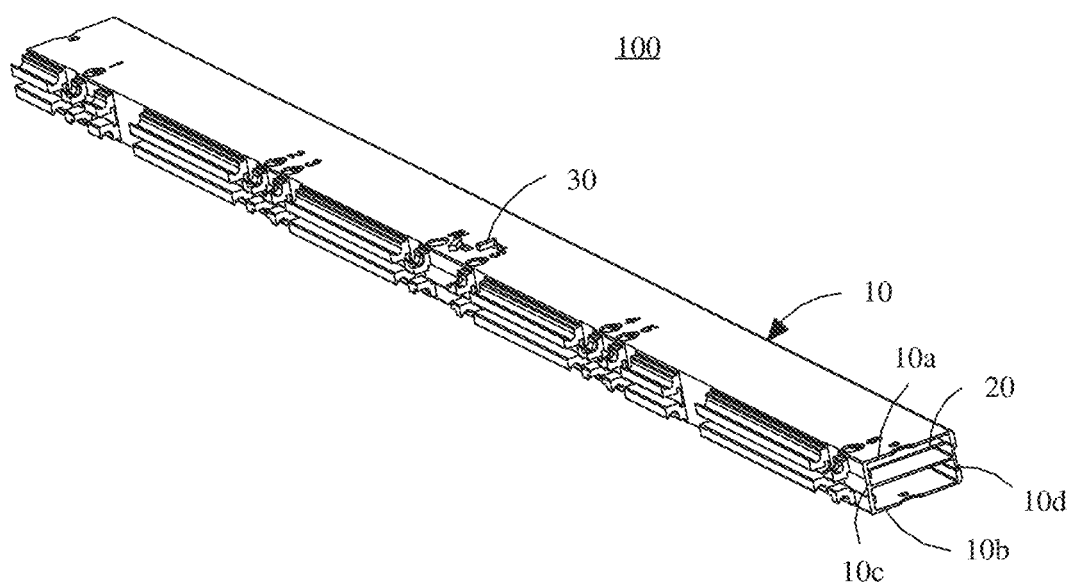
FIG. 2 is a schematic structural view of a phase shifter according to this application.
Figure 3:
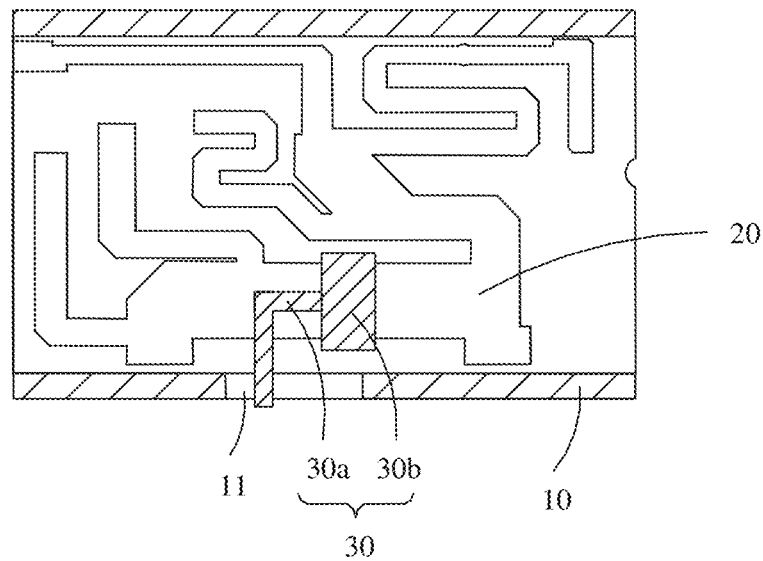
FIG. 3 is a partial schematic view of the phase shifter according to this application at a sectional position parallel to a plane on which a metal strip line is located.

Referring to FIG. 2 and FIG. 3, the phase shifter A is specifically a phase shifter too. The phase shifter too includes a cavity 10, a metal strip line 20, and a tuning accessory 30. The metal strip line 20 is located in the cavity 10. In some embodiments of this application, the cavity 10 includes one or more accommodating cavities, there may be one or more metal strip lines 20, and the metal strip lines 20 are in a one-to-one correspondence with the accommodating cavities of the cavity 10. In other words, one metal strip line 20 is disposed in each accommodating cavity of the cavity 10. In this embodiment, there are two accommodating cavities, the two accommodating cavities are stacked, and one metal strip line 20 is disposed in each accommodating cavity. In an embodiment of this application, each of opposite sides of an inner wall of the accommodating cavity are provided with a fixing groove, and an edge of the metal strip line 20 is fixed in the fixing groove, so that the metal strip line 20 is suspended in the cavity 10.

The metal strip line 20 includes a transmission body 20a, and a signal input terminal 20b and a signal output terminal 20c that are connected to the transmission body 20a. In some embodiments of this application, both the signal input terminal 20b and the signal output terminal 20c are located at an edge of the transmission body 20a, and a radio frequency signal input by the signal input terminal 20b is transmitted to the signal output terminal 20c by the transmission body 20a, and then radiated through a radio frequency antenna connected to the signal output terminal 20c. There are a plurality of signal output terminals 20c, the plurality of signal output terminals 20c are spaced apart in an extension direction of the transmission body 20a, and a sliding dielectric (not shown in the figure) capable of moving in the extension direction of the transmission body 20a is disposed on a partial region of the transmission body 20a. The sliding dielectric relative to the extension direction of the transmission body 20a is moved, and a phase of a radio frequency signal output by the signal output terminal 20c is changed, to further change a downtilt angle of a vertical beam formed by the electrically tunable antenna, so that network coverage is more flexible.

The tuning accessory 30 includes a fixing portion 30a and a tuning portion 30b connected to the fixing portion 30a. The fixing portion 30a is fastened to the cavity 10, to fasten the tuning accessory 30 to the cavity 10. The tuning portion 30b is located in the cavity 10, and the tuning portion 30b is partially or completely opposite to the metal strip line 20. An orthographic projection of a part that is of the tuning portion 30b and that is opposite to the metal strip line 20 is located on the metal strip line 20. The tuning portion 30b is used to tune input impedance of the phase shifter too. In this application, the tuning accessory 30 is located at a position unreachable by the sliding dielectric, to avoid impact of the tuning accessory 30 on sliding of the sliding dielectric.

In this application, one tuning accessory 30 is added to the phase shifter too, and the tuning accessory 30 includes a tuning portion 30b that can affect input impedance of a port. Specifically, one additional capacitance can be added to the phase shifter too by using the tuning portion 30b, and the input impedance of the port is affected by using the additional capacitance. The input impedance can affect a standing wave of the port, to tune the port standing wave by using the tuning accessory 30. Further, because the tuning accessory 30 has a specific fixed structure and is a molded part, compared with a manner of manually increasing or decreasing a solder amount in the related art, the tuning accessory 30 has higher surface precision and has fewer surface defects, and therefore PIM is not affected, so that after the tuning of the port standing wave is completed, the PIM does not need to be retested, thereby reducing a standing wave tuning time.

In some embodiments of this application, before the fixing portion 30a is fastened to the cavity 10, the tuning portion 30b may move relative to the metal strip line 20 to tune the input impedance of the phase shifter too.

In this application, before the fixing portion 30a is fastened to the cavity 10, the tuning portion 30b moves relative to the metal strip line 20, to change a relative position between the tuning portion 30b and the metal strip line 20 (namely, a position that is of the tuning portion 30b and that corresponds to the metal strip line 20), a relative area between the tuning portion 30b and the metal strip line 20 (namely, an overlapping area between the tuning portion 30b and an orthographic projection of the metal strip line 20 on a reference plane parallel to the metal strip line 20), a distance between the metal strip line 20 and the tuning portion 30b, or the like.

A capacitance calculation formula is $$C = \frac{\varepsilon \times s}{d},$$

where C is a capacitance, ε is a dielectric constant of a dielectric between a first electrode plate of the capacitance and a second electrode plate of the capacitance, s is an overlapping area of orthographic projections of the first electrode plate and the second electrode plate on a reference plane parallel to the first electrode plate and the second electrode plate, and d is a distance between the first electrode plate and the second electrode plate. In this application, the tuning portion 30b may be a metal sheet or a dielectric slab, where the dielectric slab is formed of a dielectric material such as plastic. When the tuning portion 30b is a metal sheet, the first electrode plate is the metal strip line 20, and the second electrode plate is the tuning portion 30b. Therefore, the relative area between the tuning portion 30b and the metal strip line 20 and the distance between the metal strip line 20 and the tuning portion 30b affect an amplitude of the additional capacitance added to the phase shifter too by the tuning portion 30b, thereby changing a standing wave of each port of the phase shifter too. In addition, based on periodicity of radio frequency transmission of the metal strip line 20, a capacitance value and an inductance value of the tuning portion 30b change periodically with different positions relative to the metal strip line 20. Therefore, by changing the relative position between the tuning portion 30b and the metal strip line 20, the magnitude of the additional capacitance added to the phase shifter too by the tuning portion 30b is also affected. When the tuning portion 30b is a dielectric slab, the first electrode plate is the metal strip line 20, and the second electrode plate is a cavity wall that is of the cavity 10 and that is parallel to the metal strip line 20. When the tuning portion 30b is disposed in the cavity 10, an amplitude of ε is affected, and the amplitude of the additional capacitance added to the phase shifter too by the tuning portion 30b is affected by adjusting the relative distance between the tuning portion 30b and the metal strip line 20, the relative area between the tuning portion 30b and the metal strip line 20, and the like. Before the tuning accessory 30 is fastened to the cavity 10, the tuning portion 30b moves relative to the metal strip line 20, and the standing wave of each port of the phase shifter too is detected. When the tuning portion 30b moves to a position at which the standing wave of each port of the phase shifter too reaches an optimal state, the fixing portion 30a of the tuning accessory 30 is fastened to the cavity 10, so that the tuning portion 30b is fastened at a position at which the port standing wave of the phase shifter too is in an optimal state.

In addition, for different phase shifters too, different positions of the tuning portion 30b in the phase shifter too can be adjusted, to tune the standing wave of each port of the phase shifter too to an optimal state.

In some embodiments of this application, the tuning portion 30b is a metal sheet, and there is a gap between the metal sheet and the metal strip line 20. Alternatively, the tuning portion 30b is a dielectric slab, and the dielectric slab partially covers the metal strip line 20 or is spaced from the metal strip line 20. The dielectric slab is formed of a dielectric material having a dielectric constant different from that of air. When the tuning portion 30b is a metal sheet, and there is a gap between the metal sheet and the metal strip line 20, the metal sheet, the metal strip line 20, and a dielectric located between the metal sheet and the metal strip line 20 form an additional capacitance, and input impedance of a port of the phase shifter too is affected. When the tuning portion 30b is a dielectric slab, a dielectric constant of a dielectric in the cavity 10 can be changed by the dielectric slab, to change a capacitance at a position corresponding to the dielectric slab in the cavity 10. In other words, it is equivalent to adding the additional capacitance at the position corresponding to the dielectric slab in the cavity 10.

In this embodiment, the cavity 10 is a cuboid cavity, and a length direction of the cavity 10 is the same as an extension direction of the metal strip line 20. The cavity wall of the cavity 10 includes a first wall 10a and a second wall 10b that are parallel to a plane on which the metal strip line 20 is located, and a third wall 10c and a fourth wall 10d that are perpendicular to the plane on which the metal strip line 20 is located. The first wall 10a and the second wall 10b are disposed oppositely, and the third wall 10c and the fourth wall 10d are located between the first wall 10a and the second wall 10b and connect the first wall 10a and the second wall 10b.

Figure 4:
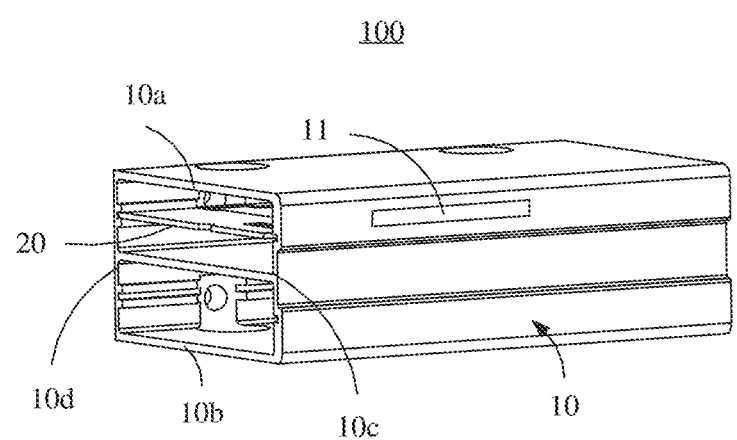
FIG. 4 is a partial schematic structural view of a phase shifter according to an embodiment of this application.
Figure 5:
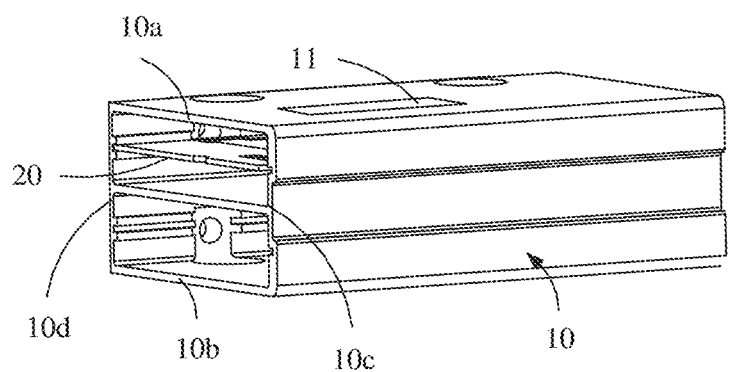
FIG. 5 is a partial schematic structural view of a phase shifter according to another embodiment of this application.

Referring to FIG. 4 and FIG. 5, in the phase shifter too according to some embodiments of this application, the third wall 10c of the cavity 10 is provided with a tuning hole 11. It may be understood that, the tuning hole 11 may alternatively be provided on the fourth wall 10d. A first end of the fixing portion 30a is connected to the tuning portion 30b, a second end opposite to the first end is located in the tuning hole 11, and can be fastened to an inner wall of the tuning hole 11 by using the second end, to fasten the tuning accessory 30 to the cavity 10. The fixing portion 30a and the cavity 10 may be fastened in various fixing manners, such as adhesive fastening, fastener fastening, and screw fastening.

Before being fastened to the cavity 10, the fixing portion 30a may move in a length direction of the tuning hole 11, to drive the tuning portion 30b to move relative to the metal strip line 20, so that projection positions of the tuning portion 30b on the metal strip line 20 are different. Amplitudes of additional capacitances generated when the tuning portion 30b is located at different positions of the metal strip line 20 change, and the tuning portion 30b can be driven to move relative to the metal strip line 20, thereby tuning the port standing wave of the phase shifter too. When the tuning portion 30b moves to a position at which the port standing wave of the phase shifter too reaches an optimal state, the fixing portion 30a of the tuning accessory 30 is fastened to the cavity 10, so that the tuning portion 30b is fastened relative to the position of the metal strip line 20, to tune the port standing wave of the phase shifter too to an optimal state.

In some embodiments of this application, an extension direction of the tuning hole 11 is the same as the extension direction of the metal strip line 20, and the fixing portion 30a drives the tuning portion 30b to move in the extension direction of the metal strip line 20, so that tuning portion 30b corresponds to different positions in the extension direction of the metal strip line 20. Because of periodicity of a radio frequency signal transmitted on the metal strip line 20, when the tuning portion 30b corresponds to different positions in the extension direction of the metal strip line 20, an amplitude of an additional capacitance formed by the tuning portion 30b in the cavity 10 changes periodically. Therefore, by moving the position of the tuning portion 30b corresponding to the extension direction of the metal strip line 20, the input impedance of the phase shifter too is tuned, and the port standing wave of the phase shifter too is tuned. The tuning portion 30b may be a metal sheet or a dielectric slab.

Further, in some embodiments of this application, the tuning hole 11 has a specific width, and a width direction of the tuning hole 11 is perpendicular to a length direction of the tuning hole 11. Before being fastened to the cavity 10, the fixing portion 30a may also move in the width direction of the tuning hole 11, so that the fixing portion 30a can drive the tuning portion 30b to move in the extension direction of the metal strip line 20, move in a direction perpendicular to the extension direction of the metal strip line 20, or move in a direction close to or away from the metal strip line 20. Therefore, the port standing wave of the phase shifter 100 can be more easily tuned to an optimal state. Specifically, in the embodiment in FIG. 4, the tuning hole 11 is provided on the third wall 10c and the fourth wall 10d, and the extension direction of the tuning hole 11 is the same as the extension direction of the metal strip line 20. The fixing portion 30a moves in the extension direction of the tuning hole 11 to drive the tuning portion 30b to move in the extension direction of the metal strip line 20 relative to the metal strip line 20, to change a relative position between the tuning portion 30b and the metal strip line 20 (namely, a position of an orthographic projection of the tuning portion 30b on the metal strip line 20); and moves in the width direction of the tuning hole 11 to drive the tuning portion 30b to move in a direction close to or away from the metal strip line 20, to change the distance between the tuning portion 30b and the metal strip line 20. It may be understood that, in this case, the fixing portion 30a may also push and pull the tuning portion 30b to move in a direction perpendicular to the extension direction of the metal strip line 20 (namely, a direction perpendicular to the third wall 10c), to change the relative area between the tuning portion 30b and the metal strip line 20. In the embodiment of FIG. 5, the tuning hole 11 is provided on the first wall 10a or the second wall 10b, and when the extension direction of the tuning hole 11 is the same as the extension direction of the metal strip line 20, the fixing portion 30a moves in the extension direction of the tuning hole 11 to drive the tuning portion 30b to move in the extension direction of the metal strip line 20 relative to the metal strip line 20, to change the relative position between the tuning portion 30b and the metal strip line 20; and moves in the width direction of the tuning hole 11 to drive the tuning portion 30b to move in a direction perpendicular to the metal strip line 20, to change the relative area between the tuning portion 30b and the metal strip line 20. It may be understood that, in this case, the fixing portion 30a may also push and pull the tuning portion 30b to move in a direction perpendicular to the plane on which the metal strip line 20 is located, to change the distance between the tuning portion 30b and the metal strip line 20. Further, in this application, the tuning hole 11 is used to fit the tuning portion 30b into the cavity 10, and one end that is of the fixing portion 30a and that is away from the tuning portion 30b extends out of the cavity 10 through the tuning hole 11, to control movement of the fixing portion 30a. A size of the tuning hole 11 is greater than a size of the tuning portion 30b, and the tuning portion 30b can penetrate into the cavity 10 through the tuning hole 11. When the port standing wave of the phase shifter too is qualified, it is obtained that the phase shifter too may not have the tuning accessory 30; and when it is detected that the port standing wave of the phase shifter too is unqualified, the tuning portion 30b can penetrate into the cavity 10 through the tuning hole 11, to tune the port standing wave of the phase shifter too. One end that is of the fixing portion 30a and that is away from the tuning portion 30b extends out of the cavity 10 through the tuning hole 11, so that the fixing portion 30a can be controlled to move along the tuning hole 11.

In the embodiment shown in FIG. 4, the tuning portion 30b is a square piece, and includes a first side edge 31 perpendicular to a length direction of the metal strip line 20. The fixing portion 30a is an "L"-shaped curved rod and includes a first section 32 and a second section 33 perpendicular to the first section 32. One end that is of the first section 32 and that is away from the second section 33 is connected to a center of the first side edge 31 of the tuning portion 30b. One end that is of the second section 33 and that is away from the first section 32 passes through the tuning hole 11, so that a part of the second section 33 passing through the tuning hole 11 can be easily pulled to drive the first section 32 to move along the metal strip line 20, to drive the tuning portion 30b to move along the metal strip line 20. In addition, because one end that is of the first section 32 and that is away from the second section 33 is connected to the center of the first side edge 31 of the tuning portion 30b, the first section 32 drives the tuning portion 30b to smoothly move along the metal strip line 20 without deviation in other directions. In addition, in this embodiment, the fixing portion 30a is relatively thin, or a manufacture procedure of a dielectric material having a dielectric constant similar to that of air is used, to minimize impact of the fixing portion 30a on the amplitude of the additional capacitance. It may be understood that, in other embodiments of this application, the fixing portion 30a may be in other structures. For example, when the tuning hole 11 is provided on the first wall 10a, the fixing portion 30a is rod-shaped, extends from the tuning hole 11 to a center of the tuning portion 30b, and is connected to the center of the tuning portion 30b.

Figure 6:
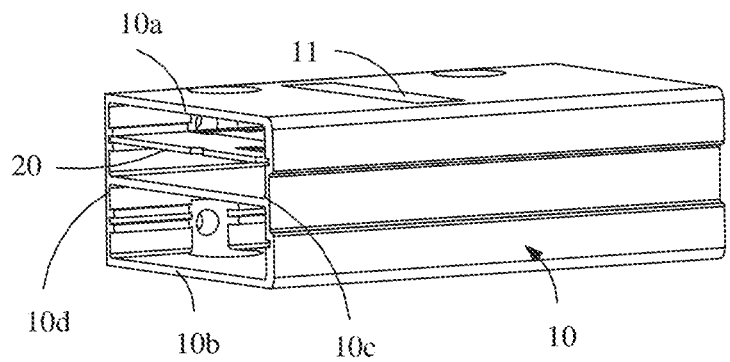
FIG. 6 is a partial schematic structural view of a phase shifter according to another embodiment of this application.

Referring to FIG. 6, FIG. 6 shows a phase shifter 200 according to another embodiment of this application. A difference between the phase shifter 200 in the embodiment shown in FIG. 6 and the phase shifter too in the embodiment shown in FIG. 5 lies in: The length direction of the tuning hole 11 is perpendicular to an extension direction of the metal strip line 20, and the fixing portion 30a drives the tuning portion 30b to move in a direction perpendicular to the extension direction of the metal strip line 20. In this embodiment, the fixing portion 30a drives the tuning portion 30b to move in a direction perpendicular to the extension direction of the metal strip line 20, to adjust a relative area between the tuning portion 30b and the metal strip line 20, and adjust the change of the amplitude of the additional capacitance brought by the tuning portion 30b, to tune the input impedance of the phase shifter too, thereby tuning the port standing wave of the phase shifter too. The tuning portion 30b may be a metal sheet or a dielectric slab. In this embodiment, the tuning accessory 30 is located on one side that is of the metal strip line 20 and that faces the first wall 10a, and the tuning hole 11 is provided on the first wall 10a parallel to the plane on which the metal strip line 20 is located. It may be understood that, in other embodiments of this application, the tuning hole 11 may alternatively be provided on the second wall 10b, the third wall 10c, or the fourth wall 10d. It may be understood that, in this embodiment, the fixing portion 30a may alternatively move in the width direction of the tuning hole 11, to change the relative position between the tuning portion 30b and the metal strip line 20. Alternatively, the fixing portion 30a is pushed and pulled relative to the tuning hole 11, to change the distance between the tuning portion 30b and the metal strip line 20.

Figure 7:
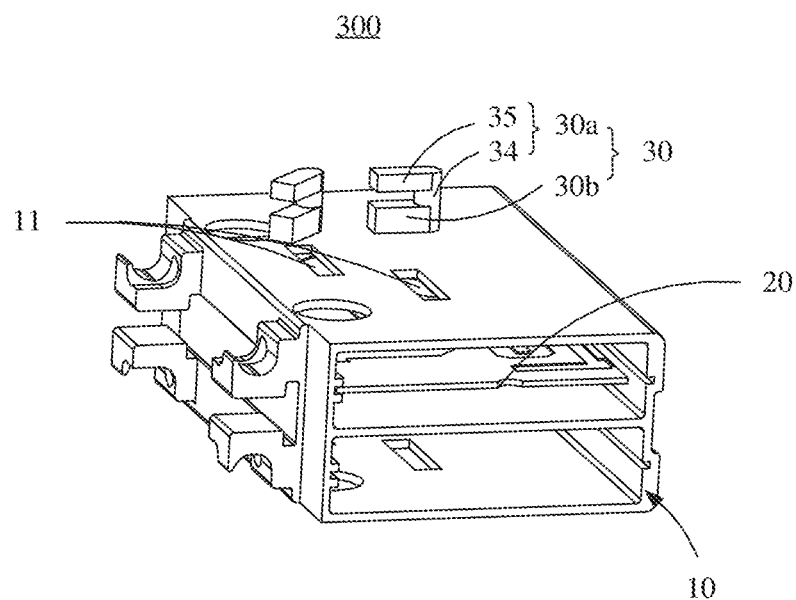
FIG. 7 is a partial schematic structural view of a phase shifter according to another embodiment of this application.
Figure 8:
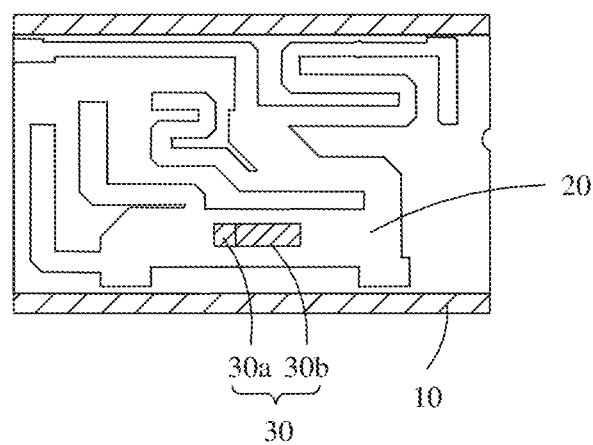
FIG. 8 is a partial schematic view of the phase shifter according to the embodiment shown in FIG. 7 at a sectional position parallel to a plane on which a metal strip line is located.

Referring to FIG. 7 and FIG. 8, this application provides a phase shifter 300 according to another embodiment. A difference between the phase shifter 300 and the phase shifter too lies in: The fixing portion 30a includes a rotating shaft 34 and a rotary handle 35, and the rotating shaft 34 is connected between the tuning portion 30b and the rotary handle 35. The rotating shaft 34 is formed of a dielectric material, and a size of the rotating shaft 34 is as small as possible, to minimize impact of the rotating shaft 34 on an amplitude of an additional capacitance. The rotating shaft 34 can rotate in the cavity 10, and an axis of the rotating shaft 34 is perpendicular to a plane on which the metal strip line 20 is located. Before the fixing portion 30a is fastened to the cavity 10, the rotating shaft 34 rotates to drive the tuning portion 30b to rotate relative to the metal strip line 20. In this embodiment, the tuning portion 30b is located in the cavity 10, and the handle 35 is located outside the cavity 10, to operate the handle 35 to rotate the tuning portion 30b. The rotating shaft 34 rotates to drive the tuning portion 30b to rotate relative to the metal strip line 20, so that the tuning portion 30b is relatively located at different positions on the metal strip line 20, thereby changing the amplitude of the additional capacitance brought by the tuning portion 30b, to tune the input impedance of the phase shifter too, thereby tuning the port standing wave of the phase shifter too.

Further, in this embodiment, a distance between the rotating shaft 34 and one end that is of the tuning portion 30b and that is away from the rotating shaft 34 is greater than a width of the metal strip line 20. Because the distance between the rotating shaft 34 and one end that is of the tuning portion 30b and that is away from the rotating shaft 34 is greater than the width of the metal strip line 20, when the tuning portion 30b rotates to a position intersecting the metal strip line 20, the relative area of the tuning portion 30b and the metal strip line 20 changes continuously. Therefore, when the relative position between the tuning portion 30b and the metal strip line 20 changes, the relative area also changes, and the amplitude of the additional capacitance can be changed more easily. In this embodiment, the tuning portion 30b is rotated by the fixing portion 30a, or the fixing portion 30a moves relative to the tuning hole 11, to move the tuning portion 30b relative to the extension direction of the metal strip line 20, move the tuning portion 30b in a direction perpendicular to the extension direction of the metal strip line 20, or change the distance between the tuning portion 30b and the metal strip line 20, thereby changing the amplitude of the additional capacitance. Therefore, the port standing wave of the phase shifter 300 is in an optimal state.

It may be understood that, in some embodiments of this application, the rotating shaft is a screw, one end of the screw passes through the cavity wall of the cavity 10 and is fastened to the tuning portion 30b, and the screw rotates before being fastened to the cavity 10, to drive the tuning portion 30b to rotate relative to the metal strip line. In addition, when the tuning portion 30b is rotated to a position at which the port standing wave of the phase shifter 300 is in an optimal state, the rotating shaft can be easily fastened to the cavity wall.

Figure 9:
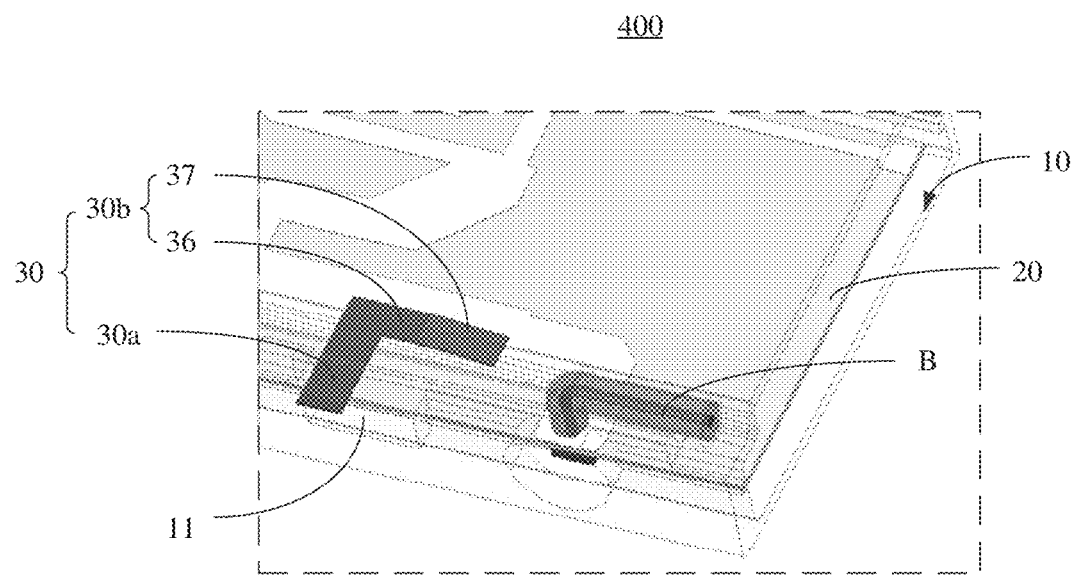
FIG. 9 is a partial structural perspective view from one direction of a phase shifter according to another embodiment of this application.
Figure 10:
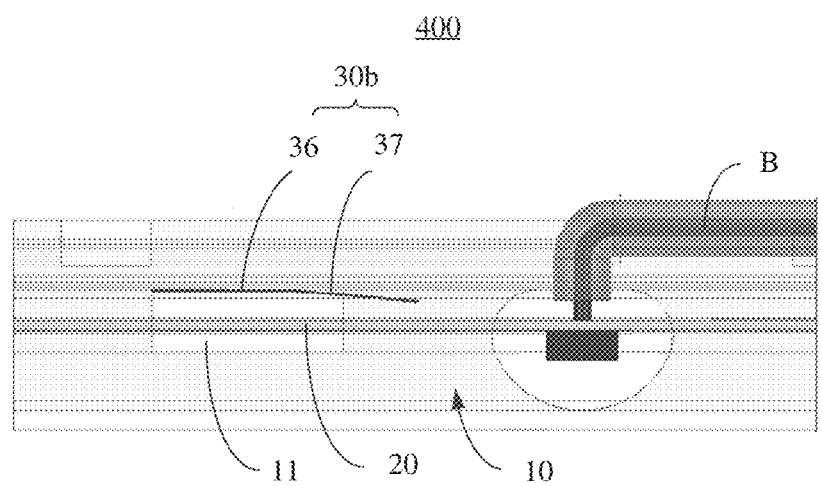
FIG. 10 is a partial structural perspective view from another direction of the phase shifter according to the embodiment shown in FIG. 9.

Referring to FIG. 9 and FIG. 10, FIG. 9 is a phase shifter 400 according to another embodiment of this application. A difference between the phase shifter 400 and the phase shifter too shown in FIG. 4 lies in: The tuning portion 30*b* is a metal dome, namely, the tuning portion 30*b* is a metal sheet with some elasticity. The metal dome and the metal strip line 20 are spaced apart. The metal dome includes a fixed region 36 and an active region 37 connected to the fixed region 36. The active region 37 is resiliently movable relative to the fixed region 36, to change an included angle between the active region 37 and the fixed region 36. A distance between the active region 37 of the metal dome and the metal strip line 20 can be changed to adjust the distance between the active region 37 of the metal dome and the metal strip line 20.

A capacitance calculation formula is $$C = \frac{\varepsilon \times s}{d},$$

where C is a capacitance, ε is a dielectric constant of a dielectric between a first electrode plate and a second electrode plate, is an overlapping area of orthographic projections of the first electrode plate and the second electrode plate on a reference plane parallel to the first electrode plate and the second electrode plate, and d is a distance between the first electrode plate and the second electrode plate. Therefore, it can be learned based on the calculation formula that, when a distance between the active region 37 and the metal strip line 20 changes, the amplitude of the additional capacitance brought by the tuning portion 30*b* changes. In this embodiment, before the fixing portion 30*a* is fastened to the cavity 10, the fixing portion 30*a* first moves in the tuning hole 11, so that the tuning portion 30*b* is located at a proper position relative to the metal strip line 20, and has a proper relative area with the metal strip line 20. A proper distance between the tuning portion 30*b* and the metal strip line 20 is adjusted, and then the fixing portion 30*a* is fastened to the cavity 10, to adjust the amplitude of the additional capacitance. Finally, the distance between the active region 37 and the metal strip line 20 can be further adjusted, to further fine-tune the amplitude of the additional capacitance. After the port standing wave of the phase shifter 100 is in a better state, the distance between the active region 37 and the metal strip line 20 is fixed. In this embodiment, one screw is connected on the cavity 10, one end of the screw passes through a cavity wall of the cavity 10 and abuts against the active region 37 of the metal dome, and a depth at which the screw is screwed into the cavity wall of the cavity 10 is adjusted, to adjust a distance between the free end and the metal strip line 20. When the distance between the free end and the metal strip line 20 is adjusted to a required position, the screw can be directly fastened to the cavity wall, so that the active region 37 of the metal dome is fastened to the position of the metal strip line 20.

Figure 11:
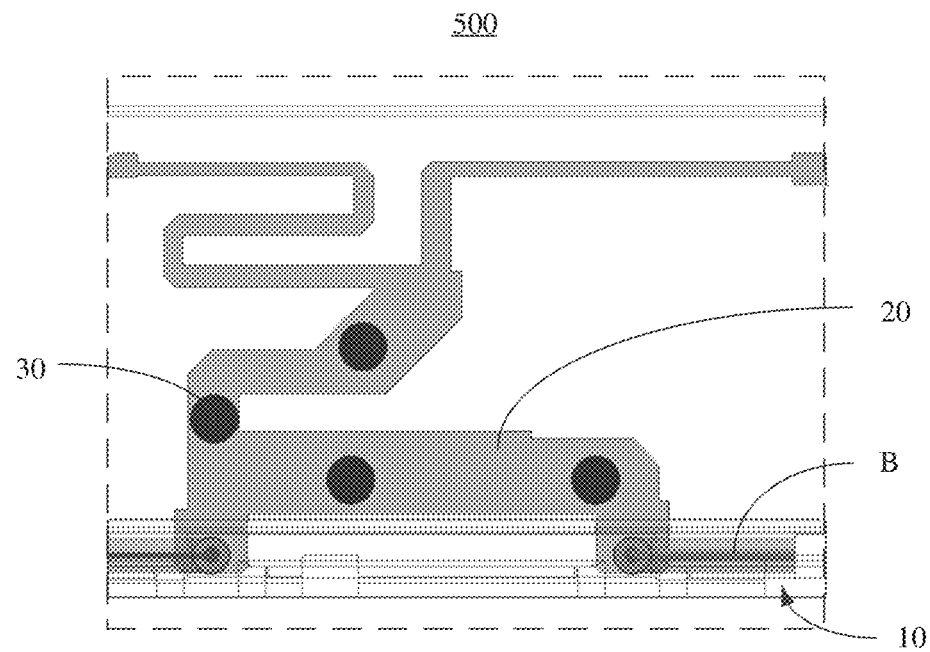
FIG. 11 is a partial schematic view of a phase shifter according to another embodiment of this application at a sectional position parallel to a plane on which a metal strip line is located.
Figure 12:
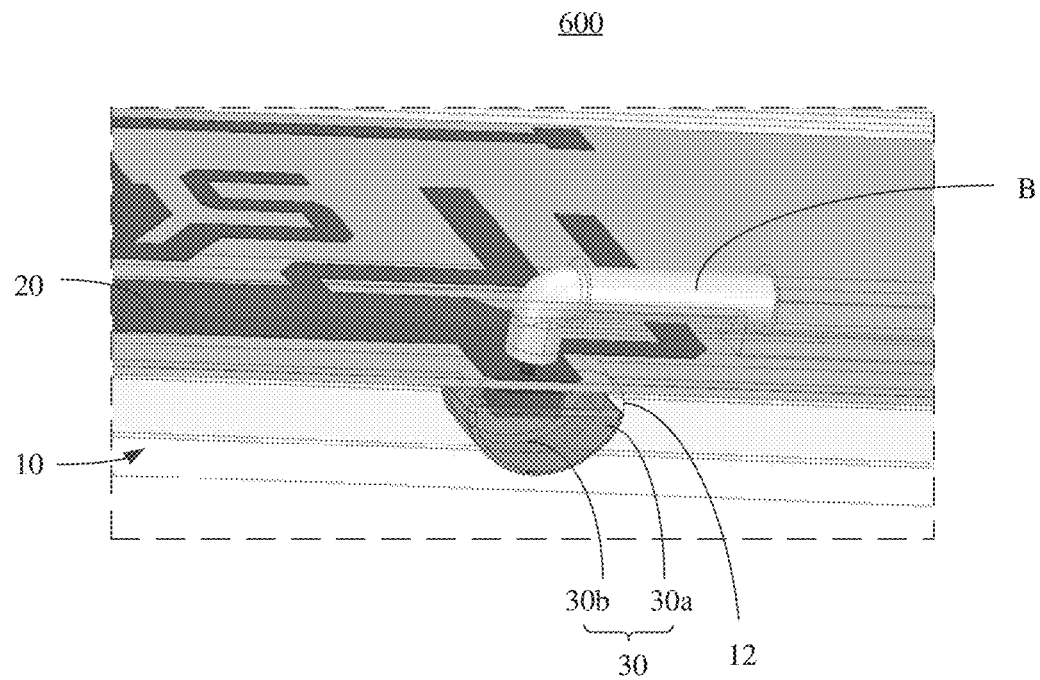
FIG. 12 is a partial structural perspective view from one direction of a phase shifter according to another embodiment of this application.

Referring to FIG. 11 and FIG. 12, in some other embodiments of this application, a plurality of openings 12 spaced apart are provided on the cavity wall of the cavity 10, and the tuning accessory 30 is disposed in one or more of the plurality of openings 12. The tuning accessory 30 is a dielectric block, and a dielectric constant of the dielectric block is greater than that of air.

Referring to FIG. 11, FIG. 11 shows a phase shifter 500 according to an embodiment of this application. Openings 12 of the phase shifter 500 are provided on a first wall 10*a* and a second wall 10*b* of the cavity 10. A projection of the dielectric block on the plane is located on the metal strip line 20. A part of the tuning accessory 30 extends into the cavity 10 through the opening 12, and the part of the tuning accessory 30 that extends into the cavity 10 is the tuning portion. A volume of the tuning portion disposed in the cavity 10 is adjusted by adjusting the quantity of the tuning accessories 30 inserted into the plurality of openings 12, thereby changing the amplitude of the additional capacitance brought by the tuning portion, to tune the port standing wave of the phase shifter 100.

A quantity of tuning accessories 30 disposed in the plurality of openings 12 is adjusted based on an actual requirement. Because the tuning accessory 30 is a dielectric block having a dielectric constant greater than that of air, when different quantities of tuning accessories 30 extend into the cavity 10, changes of the dielectric constant brought by the tuning accessories 30 are different, so that amplitudes of additional capacitances brought by the tuning accessories 30 are also different. In other words, the quantity of tuning accessories 30 extending into a port in the cavity 10 is changed, to change the amplitudes of the additional capacitances brought by the tuning accessories 30, until the port standing wave of the phase shifter too is in an optimal state.

Referring to FIG. 12, FIG. 12 shows a phase shifter 600 according to an embodiment of this application. A difference between the phase shifter 600 and the phase shifter 500 lies in: A signal input terminal and a signal output terminal of the metal strip line 20 each correspond to one opening 12, an axial projection of the opening 12 corresponding to the signal input terminal is located on the signal input terminal, and an axial projection of the opening 12 corresponding to the signal output terminal is located on the signal output terminal. In the related art, the opening 12 is used to facilitate soldering, to enable a radio frequency connection between a radio frequency antenna B and the signal output terminal by soldering, or enable a radio frequency connection between a signal transmission line and the signal input terminal by soldering. In this application, the tuning accessory 30 is disposed in the openings 12 corresponding to the signal input terminal and the signal output terminal, so that the part of the tuning accessory 30 can correspond to the signal input terminal and the signal output terminal. Therefore, while the port standing wave of the phase shifter too can be tuned, the openings 12 do not need to be additionally provided on the cavity wall of the cavity 10 of the phase shifter too, to reduce a manufacture process. A part that is of the tuning accessory 30 and that corresponds to the signal input terminal 20*b* or the signal output terminal 20*c* is the tuning portion 30*b*, and the other part is the fixing portion 30*a*.

Figure 13:
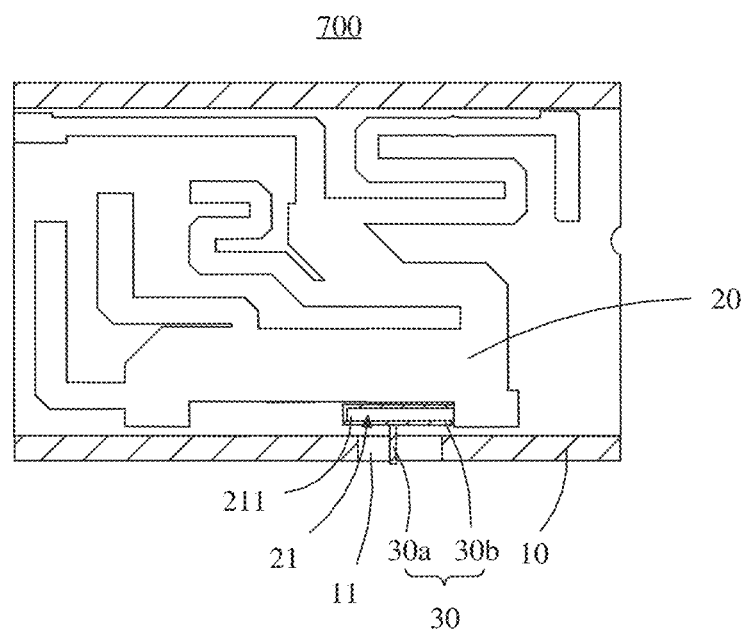
FIG. 13 is a partial schematic view of a phase shifter according to another embodiment of this application at a sectional position parallel to a plane on which a metal strip line is located.

Referring to FIG. 13, FIG. 13 shows a phase shifter 700 according to another embodiment of this application. A difference between the phase shifter 700 and the phase shifter 400 lies in: An open-circuit line 21 extends on the metal strip line 20. The open-circuit line 21 is a branch extending from the metal strip line 20, but has no actual signal transmission function. One end that is of the open-circuit line 21 and that is away from the metal strip line 20 is a free end, the tuning portion 30*b* is formed of a dielectric material, and the tuning portion 30*b* is sleeved on the open-circuit line 21 from the free end. In this embodiment, the tuning portion 30*b* includes an upper plate and a lower plate, and the open-circuit line 21 is sandwiched between the upper plate and the lower plate. It may be understood that, in other embodiments of this application, the tuning portion 30b may alternatively be in a tubular structure, and the open-circuit line 21 is inserted into the tuning portion 30b in the tubular structure. Alternatively, the tuning portion 30b may be a dielectric slab opposite to the open-circuit line 21. In this embodiment, a length of the open-circuit line 21 is less than or equal to a length of the tuning portion 30b. The cavity wall of the cavity 10 is provided with a tuning hole 11, the fixing portion 30a is connected to the tuning portion 30b, and the fixing portion 30a moves in an extension direction of the tuning hole 11 before being fastened to the cavity 10, and drives the tuning portion 30b to move relative to the open-circuit line 21. The tuning portion 30b can be driven to move relative to the open-circuit line 21 to change a relative area between the open-circuit line 21 and the tuning portion 30b, thereby changing an additional capacitance. When the additional capacitance is changed so that the port standing wave of the phase shifter 700 is in a better state, the fixing portion 30a of the tuning accessory 30 is fastened to the cavity 10, namely, the tuning portion 30b is fastened to the position of the open-circuit line 21, so that the port standing wave of the phase shifter 700 maintains in the better state.

In this application, one tuning accessory 30 is added to the phase shifter, and one additional capacitance is added to the phase shifter by using the tuning portion 30b of the tuning accessory 30, and the input impedance of the port by using the additional capacitance is affected, to further affect a tuning port standing wave, thereby tuning the port standing wave by using the tuning accessory. In addition, the tuning accessory in this application is a molded part and has a specific fixed structure. Compared with a manner of manually increasing or decreasing a solder amount in the related art, the tuning accessory has higher surface precision and has fewer surface defects, and therefore PIM is not affected, so that after tuning of the port standing wave is completed, the PIM does not need to be retested, thereby reducing a standing wave tuning time.

The foregoing descriptions are preferred implementations of this application. It should be noted that a person of ordinary skill in the art may make several improvements or polishing without departing from the principle of this application and the improvements or polishing shall fall within the protection scope of this application.

What is claimed is:

1. A phase shifter, comprising:
   a cavity;
   a metal strip line disposed in the cavity; and
   a tuning accessory, comprising a physical connector and a component connected to the physical connector, wherein the physical connector is configured to fasten the component to the cavity, the component is disposed in the cavity, the component is partially or completely opposite to the metal strip line, a projection of a part of the component that is opposite to the metal strip line is located on the metal strip line, and the component is configured to be movable to tune input impedance of the phase shifter;
   wherein:
   the component comprises a metal sheet, and the metal sheet is spaced from the metal strip line; or
   the component comprises a dielectric slab, and the dielectric slab at least partially covers the metal strip line or is spaced from the metal strip line;
   wherein a hole extends in a sidewall of the cavity, a first end of the physical connector is connected to the component, and a second end of the physical connector is opposite to the first end and is located in the hole; and
   wherein the second end of the physical connector is configured to move in a length direction of the hole, to drive the component to move relative to the metal strip line, and the physical connector is configured to fasten the component to the cavity after the second end of the physical connector is moved in the length direction of the hole.

2. The phase shifter according to claim 1, wherein the component being configured to be movable to tune the impedance of the phase shifter comprises the component being configured to be movable relative to the metal strip line to tune the input impedance of the phase shifter.

3. The phase shifter according to claim 1, wherein an extension direction of the hole is the same as an extension direction of the metal strip line, and the second end of the physical connector is configured to move in the extension direction of the hole, to drive the component to move in the extension direction of the metal strip line.

4. The phase shifter according to claim 1, wherein the sidewall extends along a first plane, the metal strip line is disposed on a surface that extends along a second plane, the first plane is parallel to the second plane, the length direction of the hole is perpendicular to an extension direction of the metal strip line, and the second end of the physical connector is configured to move in an extension direction of the hole, to drive the component to move in a direction perpendicular to the extension direction of the metal strip line.

5. The phase shifter according to claim 1, wherein the hole is configured to fit the component into the cavity, and the second end of the physical connector extends out of the cavity through the hole.

6. The phase shifter according to claim 1, wherein the component comprises a metal dome, the metal dome is spaced from the metal strip line, the metal dome comprises a fixed region and an active region connected to the fixed region, and the metal dome is configured in a manner that a distance between the active region and the metal strip line is adjustable.

7. The phase shifter according to claim 6, wherein a screw or a screw bolt passes through a cavity wall of the cavity and abuts against the active region of the metal dome, a depth at which the screw is screwed into the cavity wall of the cavity is adjustable to adjust a distance between a free end of the screw and the metal strip line, and the screw or the screw bolt is formed of a dielectric material.

8. The phase shifter according to claim 1, wherein the physical connector comprises a rotating shaft, an axis of the rotating shaft is perpendicular to a plane of a surface on which the metal strip line is disposed, and the physical connector is configured in a manner that the rotating shaft rotates to drive the component to rotate relative to the metal strip line, and to fasten the component to the cavity after the component is rotated relative to the metal strip line.

9. The phase shifter according to claim 8, wherein a distance between the rotating shaft and an end of the component that faces away from the rotating shaft is greater than a width of the metal strip line.

10. The phase shifter according to claim 1, wherein a plurality of openings spaced apart from each other extend in a cavity wall of the cavity, the tuning accessory is disposed in one or more of the plurality of openings, the tuning accessory comprises the dielectric block, and a dielectric constant of the dielectric block is greater than that of air.

11. The phase shifter according to claim 10, wherein a part of the tuning accessory extends into the cavity through the opening of the plurality of openings in which the tuning accessory is disposed, and the part of the tuning accessory that extends into the cavity is the component.

12. The phase shifter according to claim 10, wherein the metal strip line further comprises a signal input terminal and a signal output terminal, the signal input terminal and the signal output terminal each correspond to one opening of the plurality of openings, an axial projection of the one opening corresponding to the signal input terminal is located on the signal input terminal, and an axial projection of the one opening corresponding to the signal output terminal is located on the signal output terminal.

13. The phase shifter according to claim 1, wherein an open-circuit line extends on the metal strip line, an end of the open-circuit line that faces away from the metal strip line is a free end, the component comprises a dielectric material, the component is sleeved on the open-circuit line from the free end, and a length of the open-circuit line is less than or equal to a length of the component; and
    wherein the second end of the physical connector is configured to drive the component to move relative to the open-circuit line.

14. An electrically tunable antenna, comprising:
  a phase shifter, comprising:
    a cavity;
    a metal strip line disposed in the cavity; and
    a tuning accessory, comprising a physical connector and a component connected to the physical connector, wherein the physical connector is configured to fasten the component to the cavity, the component is disposed in the cavity, the component is partially or completely opposite to the metal strip line, a projection of a part of the component that is opposite to the metal strip line is located on the metal strip line, and the component is configured to be movable to tune input impedance of the phase shifter;
    wherein:
      the component comprises a metal sheet, and the metal sheet is spaced from the metal strip line; or
      the component comprises a dielectric slab, and the dielectric slab at least partially covers the metal strip line or is spaced from the metal strip line;
    wherein a hole extends in a sidewall of the cavity, a first end of the physical connector is connected to the component, and a second end of the physical connector is opposite to the first end and is located in the hole; and
    wherein the second end of the physical connector is configured to move in a length direction of the hole, to drive the component to move relative to the metal strip line, and the physical connector is configured to fasten the component to the cavity after the second end of the physical connector is moved in the length direction of the hole.

15. A base station, comprising:
  an antenna, comprising a phase shifter, the phase shifter comprising:
    a cavity;
    a metal strip line disposed in the cavity; and
    a tuning accessory, comprising a physical connector and a component connected to the physical connector, wherein the physical connector is configured to fasten the component to the cavity, the component is disposed in the cavity, the component is partially or completely opposite to the metal strip line, a projection of a part of the component that is opposite to the metal strip line is located on the metal strip line, and the component is configured to be movable to tune input impedance of the phase shifter;
    wherein:
      the component comprises a metal sheet, and the metal sheet is spaced from the metal strip line; or
      the component comprises a dielectric slab, and the dielectric slab at least partially covers the metal strip line or is spaced from the metal strip line;
    wherein a hole extends in a sidewall of the cavity, a first end of the physical connector is connected to the component, and a second end of the physical connector is opposite to the first end and is located in the hole; and
    wherein the second end of the physical connector is configured to move in a length direction of the hole, to drive the component to move relative to the metal strip line, and the physical connector is configured to fasten the component to the cavity after the second end of the physical connector is moved in the length direction of the hole.

16. The base station according to claim 15, wherein the component being configured to be movable to tune the impedance of the phase shifter comprises the component being configured to be movable relative to the metal strip line to tune the input impedance of the phase shifter.

17. The base station according to claim 15, wherein an extension direction of the hole is the same as an extension direction of the metal strip line, and the second end of the physical connector is configured to move in the extension direction of the hole, to drive the component to move in the extension direction of the metal strip line.

18. The base station according to claim 15, wherein the sidewall extends along a first plane, the metal strip line is disposed on a surface that extends along a second plane, the first plane is parallel to the second plane, the length direction of the hole is perpendicular to an extension direction of the metal strip line, and the second end of the physical connector is configured to move in an extension direction of the hole, to drive the component to move in a direction perpendicular to the extension direction of the metal strip line.

19. The electrically tunable antenna according to claim 14, wherein the component being configured to be movable to tune the impedance of the phase shifter comprises the component being configured to be movable relative to the metal strip line to tune the input impedance of the phase shifter.

20. The electrically tunable antenna according to claim 14, wherein an extension direction of the hole is the same as an extension direction of the metal strip line, and the second end of the physical connector is configured to move in the extension direction of the hole, to drive the component to move in the extension direction of the metal strip line.

* * * * *